(12) United States Patent
Kodera

(10) Patent No.: US 7,486,059 B2
(45) Date of Patent: *Feb. 3, 2009

(54) POWER SUPPLY CIRCUIT, AND TESTING APPARATUS

(75) Inventor: Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 327 days.

This patent is subject to a terminal disclaimer.

(21) Appl. No.: 11/393,299

(22) Filed: Mar. 30, 2006

(65) Prior Publication Data

US 2007/0090820 A1    Apr. 26, 2007

(30) Foreign Application Priority Data

Mar. 31, 2005    (JP)    ............................. 2005-103403

(51) Int. Cl.
G05F 1/40    (2006.01)
(52) U.S. Cl. .................. 323/282; 323/284; 323/285; 323/259; 324/771
(58) Field of Classification Search ................. 323/222, 323/225, 282, 284, 285, 290, 344, 351, 259; 363/63; 324/763, 771
See application file for complete search history.

(56) References Cited

U.S. PATENT DOCUMENTS 5,196,995 A  *  3/1993  Gulczynski  .................. 323/225
5,929,615 A  *  7/1999  D'Angelo et al.  ............ 323/282
6,853,570 B2 * 2/2005  De Vries  ..................... 363/131
2006/0255784 A1* 11/2006  Kodera  ........................ 323/282

OTHER PUBLICATIONS

Takamasa Hori, Inter-University Power Electronics, First Edition, Ohmsha Ltd., Dec. 1996, pp. 85-102.

* cited by examiner

Primary Examiner—Jessica Han
(74) Attorney, Agent, or Firm—Osha • Liang LLP

(57) ABSTRACT

There is provided a power-supply circuit for supplying voltage to a load, having a power supply that generates power-supply voltage, an inverted outputting circuit having a positive voltage terminal for outputting positive voltage based on the power-supply voltage and a negative voltage terminal for outputting negative voltage generated based on the power-supply voltage and having different polarity from the positive voltage and outputting the positive and negative voltage while keeping the same direction in terms of directions of electric current flowing between the positive voltage terminal and the outside and of electric current flowing between the negative voltage terminal and the outside, a step-down output circuit for outputting predetermined step-down output voltage to the outside by connecting the positive and negative voltage terminals to the outside while switching them with a predetermined duty ratio and a step-up output circuit for supplying step-up output voltage whose absolute value is greater than that of the step-down output voltage by switching whether or not to connect the step-down output circuit to the load with a predetermined duty ratio.

12 Claims, 5 Drawing Sheets

POWER SUPPLY CIRCUIT, AND TESTING APPARATUS

CROSS REFERENCE TO RELATED APPLICATION

The present application claims priority from a Japanese Patent Application(s) No. 2005-103403 filed on Mar. 31, 2005, the contents of which are incorporated herein by reference.

BACKGROUND OF THE INVENTION

1. Field of the Invention

The present invention relates to a power-supply circuit and a test apparatus. More specifically, the invention relates to a power-supply circuit for supplying voltage to a load and a test apparatus for testing a device-under-test.

2. Related Art

Conventionally, there has been known a power-supply circuit for supplying predetermined voltage to a load by using a switching amplifying circuit (Takamasa Hori, Inter-University Power Electronics, First Edition, Ohmsha Ltd., December, 1996, pp. 85-102). Such power-supply circuit supplies the predetermined voltage to the load by switching, by means of a switch, a case of supplying the predetermined voltage to the load as power-supply voltage generated by a power supply accumulates electromagnetic energy in an inductance provided on a circuit and a case of supplying the predetermined voltage to the load by disconnecting the power supply from the load and by regenerating the current by using the electromagnetic energy accumulated in the inductance. Then, in such power-supply circuit, the voltage $V_O$ supplied to the load may be represented by means of a duty ratio D between a first switch for connecting the power-supply voltage to the inductance and a second switch for regenerating the current by the inductance, and of the power-supply voltage $V_s$ as $V_O = V_s \times D$.

Although the conventional power-supply circuit is capable of controlling the voltage $V_O$ to be supplied to the load by controlling the duty ratio D, it has been unable to freely select positive voltage and negative voltage and to supply them to the load by using single power supply because polarity of the $V_O$ is decided by polarity of the power-supply voltage $V_s$.

SUMMARY OF THE INVENTION

Accordingly, it is an object of the invention to provide a power supply and a test apparatus, which are capable of solving the above-mentioned problems. This object may be achieved through the combination of features described in independent claims of the invention. Dependent claims thereof specify preferable embodiments of the invention.

That is, according to a first aspect of the invention, there is provided a power-supply circuit for supplying voltage to a load, having a power supply that generates power-supply voltage, an inverted outputting circuit having a positive voltage terminal for outputting positive voltage based on the power-supply voltage and a negative voltage terminal for outputting negative voltage generated based on the power-supply voltage and having different polarity from the positive voltage and outputting the positive and negative voltage while keeping the same direction in terms of directions of electric current flowing between the positive voltage terminal and the outside and of electric current flowing between the negative voltage terminal and the outside, a step-down output circuit for outputting predetermined step-down output voltage to the outside by connecting the positive and negative voltage terminals to the outside while switching them with a predetermined duty ratio and a step-up output circuit for supplying step-up output voltage whose absolute value is greater than that of the step-down output voltage by switching whether or not to connect the step-down output circuit to the load with a predetermined duty ratio.

The inverted outputting circuit may further include an inverting inductance whose one end is connected to the side of a negative electrode of the power supply and whose other end is connected to the side of a negative voltage terminal, a first inverting switch whose one end is connected to the side of the other end of the inverting inductance and whose other end is connected to the side of the negative voltage terminal and a second inverting switch whose one end is connected to a line between another end of the inverting inductance and one end of the first inverting switch and whose other end is connected to a line between a positive electrode of the power supply and the positive voltage terminal, and the power-supply circuit may further include an inverted output control section for controlling the first and second inverting switches so as to disconnect the second inverting switch in connecting the first inverting switch and to connect the second inverting switch in disconnecting the first inverting switch.

The step-down output circuit may have a step-down inductance whose one end is connected to the side of the positive voltage terminal and the negative voltage terminal and whose other end is connected to the side of the step-up output circuit, a first step-down switch whose one end is connected to the side of the negative voltage terminal and whose other end is connected to a line between the positive voltage terminal and the step-down inductance and a second step-down switch whose one end is connected to the side of the positive voltage terminal and whose other end is connected to a line between the other end of the first step-down switch and one end of the step-down inductance, and the power-supply circuit may further include a step-down output control section for controlling the first and second step-down switches so as to disconnect the second step-down switch in connecting the first step-down switch and to connect the second step-down switch in disconnecting the first step-down switch and the inverted output control section may prolong a time during which the second inverting switch is connected to be longer than a time during which the second step-down switch is connected in flowing current from the negative voltage terminal to the outside in order to generate the predetermined negative voltage by the inverting inductance by flowing feedback current from the step-down output circuit to the inverted output circuit into the inverting inductance.

The inverted output control section may shorten the time during which the second inverting switch is connected to be shorter than the time during which the second step-down switch is connected in flowing current from the step-down output circuit to the negative voltage terminal so as to flow the current flown into the negative voltage terminal into the inverting inductance so that the inverting inductance generates the predetermined negative voltage.

The step-up output circuit may have a first step-up switch whose one end is connected to the side of another end of the step-down inductance and whose other end is connected to the side of the load, and a second step-up switch whose one end is connected to a line between the other end of the step-down inductance and one end of the first step-up switch and whose other end is connected to a line between the negative electrode of the power supply and one end of the inverting inductance, and the power-supply circuit may further include a step-up output control section for controlling the first and second step-up switches so as to disconnect the second step-up switch in connecting the first step-up switch and to connect the second step-up switch in disconnecting the first step-up switch.

The step-up output control section may also connect the second step-up switch when the second step-down switch is connected and may disconnect the second step-up switch when the second step-down switch is disconnected.

The step-up output control section may also connect the second step-up switch when the second step-down switch is connected and may disconnect the second step-up switch when the second step-down switch is disconnected in order to supply the step-up output voltage higher than the positive voltage to the load.

The step-up output control section may also disconnect the second step-up switch when the second step-down switch is connected and may connect the second step-up switch when the second step-down switch is disconnected.

The step-up output control section may also disconnect the second step-up switch when the second step-down switch is connected and may connect the second step-up switch when the second step-down switch is disconnected in order to supply the step-up output voltage lower than the negative voltage to the load.

The power-supply circuit may further include a plurality of step-up output circuits for supplying the step-up output voltage to loads different from each other and a plurality of step-down output circuit for outputting the step-down output voltage to the step-up output circuits different from each other, and the inverted output circuit may output the positive voltage and the negative voltage to each one of the plurality of step-down output circuits while keeping the same direction in terms of directions of current between the positive voltage terminal and each one of the plurality of step-down output circuits and of current between the negative voltage terminal and the plurality of step-down output circuits.

According to a second aspect of the invention, there is provided a test apparatus for testing a device-under-test, having a power source for generating power-supply voltage, an inverted output circuit having a positive voltage terminal for outputting positive voltage based on the power-supply voltage and a negative voltage terminal for outputting negative voltage that generated based on the power-supply voltage and having a polarity that is different from the positive voltage and outputting the positive voltage and the negative voltage by keeping the same direction in terms of directions of current flowing between the positive voltage terminal and the outside and of current flowing between the negative voltage terminal and the outside, a step-down output circuit for supplying predetermined step-down output voltage to the outside by connecting the positive voltage terminal and the negative voltage terminal to the outside while switching them with a predetermined duty ratio, a step-up output circuit for supplying step-up output voltage whose absolute value is greater than that of the step-down output voltage to the device-under-test by switching whether or not connect the step-down output circuit to the device-under-test with a predetermined duty ratio and a testing section for testing the device-under-test in the state in which voltage is supplied by the step-up output circuit to the device-under-test.

The test apparatus may include a plurality of step-up output circuits for supplying the step-up output voltage to loads different from each other and a plurality of step-down output circuits for outputting the step-down output voltage to the step-up output circuits different from each other, and the inverted output circuit may output the positive voltage and the negative voltage to each one of the plurality of step-down output circuits by keeping the same direction in terms of directions of current flowing between the positive voltage terminal and each of the plurality of step-down output circuits and of current flowing between the negative voltage terminal and each of the plurality of step-down output circuits.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
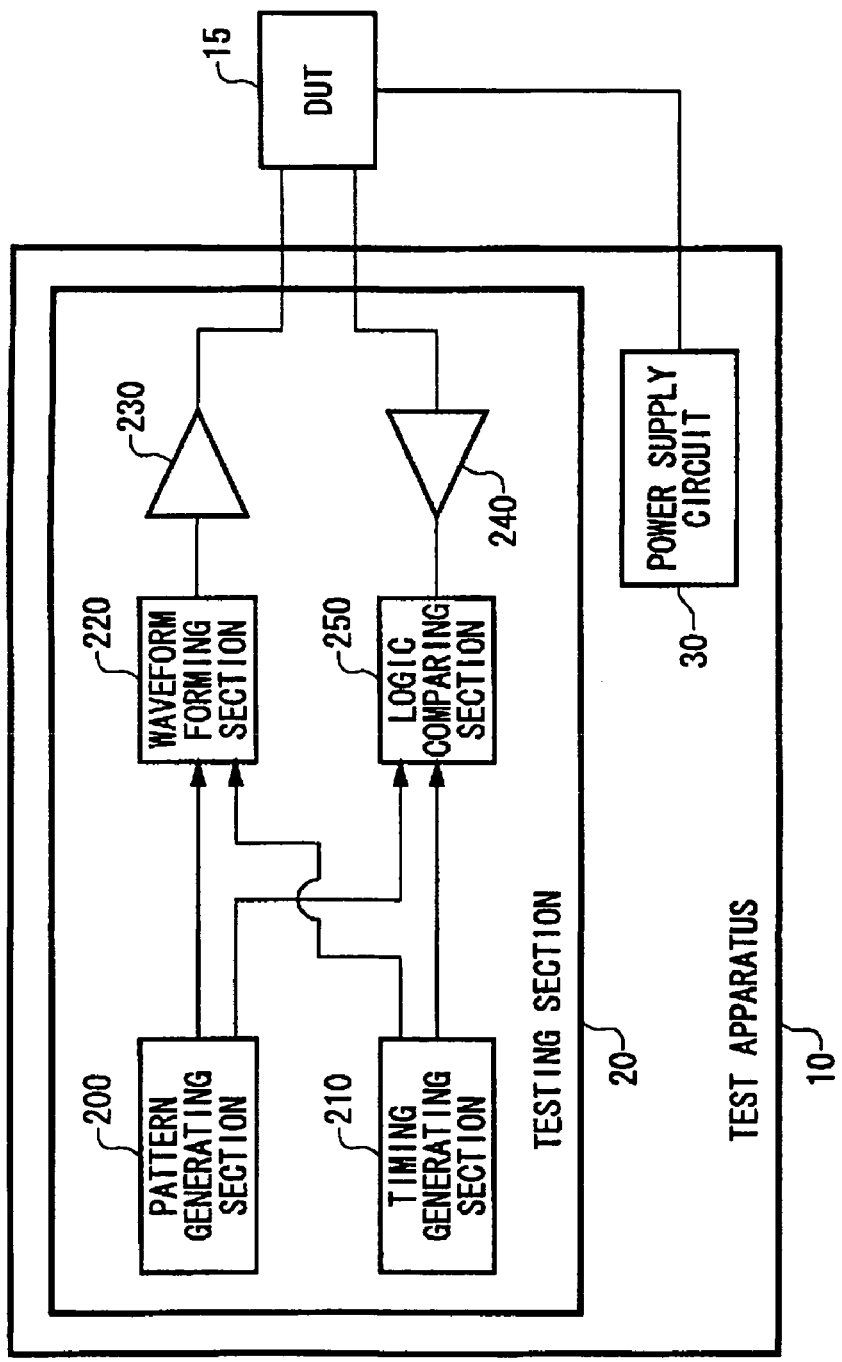
FIG. 1 is a block diagram showing one exemplary configuration of a test apparatus 10 according to an embodiment of the invention.

FIG. 1 is a block diagram showing one exemplary configuration of a test apparatus 10 according to an embodiment of the invention. The test apparatus 10 of the present embodiment tests a DUT (Device Under Test) 15. It is also an object of the test apparatus 10 to freely select positive voltage and negative voltage as driving voltage to supply to the DUT 15 and to enlarge a range of voltage to be supplied.

The test apparatus 10 of the present embodiment has a testing section 20 and a power-supply circuit 30. The testing section 20 tests the DUT 15 in a state in which the power-supply circuit 30 supplies voltage to the DUT 15. The testing section 20 has a pattern generating section 200, a timing generating section 210, a waveform forming section 220, a driver 230, a comparator 240 and a logic comparing section 250. The pattern generating section 200 generates a pattern of a test signal to be supplied to the DUT 15 and an expected value corresponding to that pattern. Then, the pattern generating section 200 outputs the generated pattern to the waveform forming section 220. The pattern generating section 200 also outputs the generated expected value to the logic comparing section 250. The timing generating section 210 generates a timing signal representing timing for supplying the test signal to the DUT 15. Then, the timing generating section 210 outputs the generated timing signals to the waveform forming section 220 and the logic comparing section 250.

The waveform forming section 220 forms waveform of the test signal based on the pattern of the test signal generated by the pattern generating section 200 and the timing signal generated by the timing generating section 210. Then, the waveform forming section 220 outputs the test signal whose waveform has been formed to the driver 230. The driver 230 supplies the test signal received from the waveform forming section 220 to the DUT 15. The comparator 240 compares an output signal outputted out of the DUT 15 in correspondence to the test signal supplied to the driver 230 with predetermined reference voltage. Then, the comparator 240 outputs a logic value, i.e., the result of the comparison, to the logic comparing section 250. The logic comparing section 250 compares the logic value received from the comparator 240 with the expected value received from the pattern generating section 200. Then, when the received logic value does not coincide with the expected value, the logic comparing section 250 judges that the DUT 15 is defective. The power-supply circuit 30 supplies voltage to the DUT 15 to drive the DUT 15.

Figure 2:
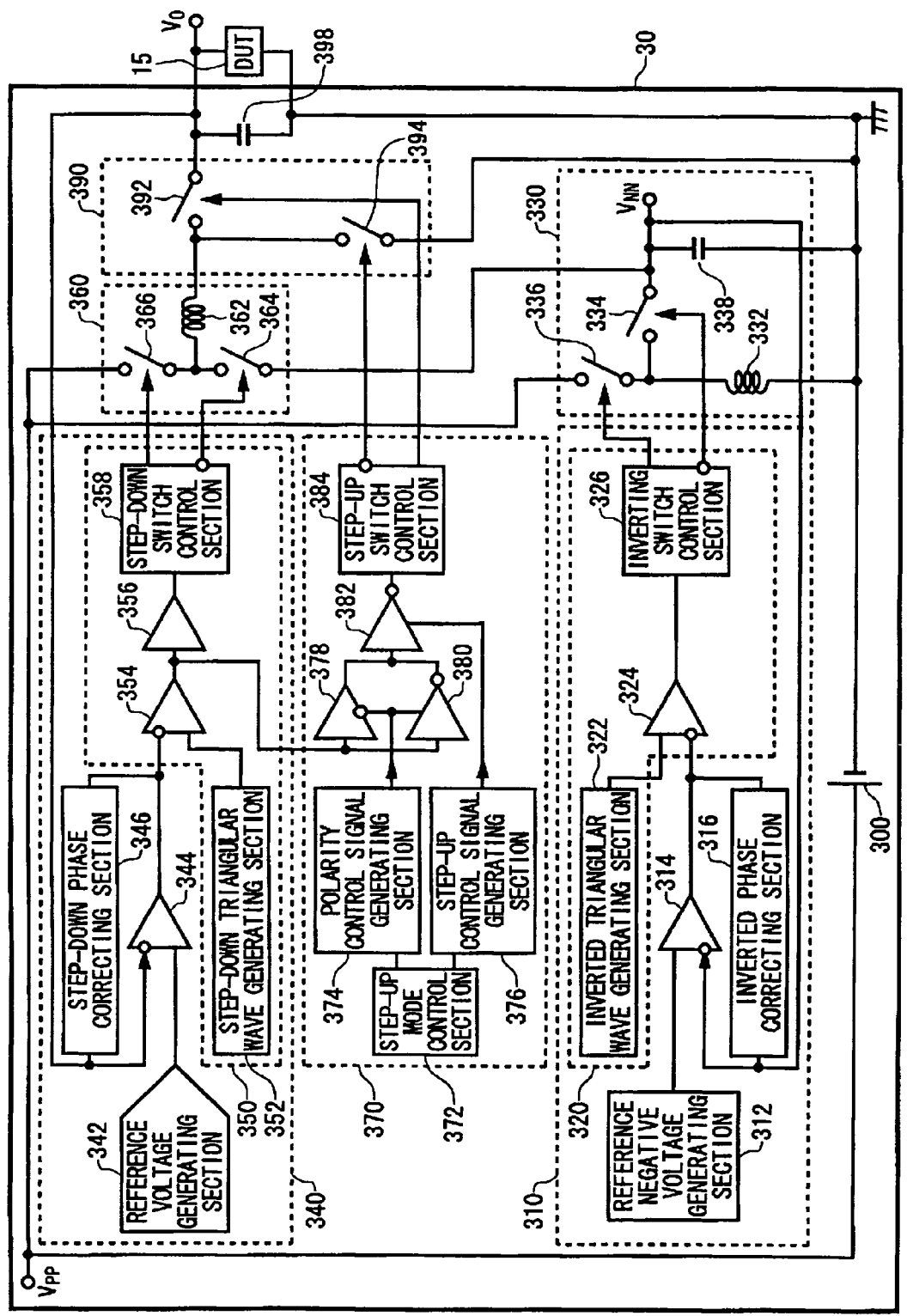
FIG. 2 is a diagram showing one exemplary configuration of a power-supply circuit 30 according to the embodiment of the invention.

FIG. 2 is a diagram showing one exemplary configuration of the power-supply circuit 30 of the present embodiment. The power-supply circuit 30 of the present embodiment has a power supply 300, an inverted output control section 310, an inverted output circuit 330, a step-down output control section 340, a step-down output circuit 360, a step-up output control section 370, a step-up output circuit 390 and a step-up capacitor 398. The power supply 300 generates power-supply voltage and outputs the generated power-supply voltage to the inverted output circuit 330 and the step-down output circuit 360.

The inverted output control section 310 includes a reference negative voltage generating section 312, a difference detector 314, an inverted phase correcting section 316 and an inverted on-duty deciding section 320. The reference negative voltage generating section 312 generates reference negative voltage that is the standard of the negative voltage to be generated by the inverted output circuit 330. Then the reference negative voltage generating section 312 outputs the generated reference negative voltage to the difference detector 314. The difference detector 314 outputs a signal that represents a difference between the reference negative voltage received from the reference negative voltage generating section 312 and the negative voltage generated by the inverted output circuit 330 to the inverted on-duty deciding section 320. The inverted phase correcting section 316 corrects phase of a signal representing the negative voltage outputted out of the inverted output circuit 330 and inputted to the difference detector 314 so that phase of the signal outputted out of the difference detector 314 becomes closer to the phase of the signal representing the negative voltage outputted out of the inverted output circuit 330. It enables the difference detector 314 to accurately calculate the difference between the reference negative voltage and the negative voltage generated by the inverted output circuit 330.

Based on the result detected by the difference detector 314, the inverted on-duty deciding section 320 controls the inverted output circuit 330 so that the negative voltage outputted out of the inverted output circuit 330 becomes closer to the reference negative voltage. The inverted on-duty deciding section 320 includes an inverted triangular wave generating section 322, a comparator 324 and an inverting switch control section 326. The inverted triangular wave generating section 322 generates a signal presenting a triangular wave having predetermined amplitude and frequency. Then, the inverted triangular wave generating section 322 outputs the generated signal to the comparator 324. The comparator 324 outputs a difference between the signal received from the inverted triangular wave generating section 322 and the signal representing the difference between the negative voltage generated by the inverted output circuit 330 and the reference negative voltage, received from the difference detector 314, to the inverting switch control section 326 as a comparison result. Here, the comparator 324 may amplify and output the comparison result to the inverting switch control section 326.

Based on the signal received from the comparator 324, the inverting switch control section 326 controls first and second switches 334 and 336 contained in the inverted output circuit 330. Here, the inverting switch control section 326 inverts a signal for controlling the first inverting switch 334 and a signal for controlling the second inverting switch 336 from each other. That is, the inverting switch control section 326 controls the first and second inverting switches 334 and 336 so as to disconnect the second inverting switch 336 in connecting the first inverting switch 334 and to connect the second inverting switch 336 in disconnecting the first inverting switch 334. More specifically, the inverting switch control section 326 may connect the second inverting switch 336 during when the signal received from the comparator 324 presents a positive difference, i.e., during when the logic value is H for example, by outputting the signal received from the comparator 324 as the control signal of the second inverting switch 336. The inverting switch control section 326 may also connect the first inverting switch 334 during when the signal received from the comparator 324 presents a negative difference, i.e., during when the logic value is L for example, by outputting an inversion signal of the received signal as the control signal of the first inverting switch 334. The inverted on-duty deciding section 320 decides inverted on-duty that is a ratio of a time during which the second inverting switch 336 is connected to a time during which the first inverting switch 334 is connected by performing PWM (Pulse Width Modulation) as described above.

The inverted output circuit 330 includes a positive voltage terminal for outputting positive voltage $V_{PP}$ based on the power-supply voltage and a negative voltage terminal for outputting negative voltage $V_{NN}$ that is generated based on the power-supply voltage and whose polarity is different from the positive voltage $V_{PP}$, and outputs the positive voltage $V_{PP}$ and the negative voltage $V_{NN}$ while keeping the same direction in terms of directions of current flowing between the positive voltage terminal and the outside, i.e., the step-down output circuit 360, and of current flowing between the negative voltage terminal and the outside. The inverted output circuit 330 includes an inverting inductance 332, the first inverting switch 334, the second inverting switch 336 and an inverted capacitor 338. One end of the inverting inductance 332 is connected to the negative electrode side of the power supply 300 and another end thereof is connected to the side of the negative voltage terminal. One end of the first inverting switch 334 is connected to the side of the other end of the inverting inductance 332 and another end thereof is connected to the side of the negative voltage terminal. One end of the second inverting switch 336 is connected to a line between the other end of the inverting inductance 332 and one end of the first inverting switch 334 and another end thereof is connected to a line between the positive electrode of the power supply 300 and the positive voltage terminal that is an end for outputting positive voltage to the step-down output circuit 360. One end of the inverted capacitor 338 is connected to a line between the negative electrode of the power supply 300 and one end of the inverting inductance 332 and another end thereof is connected to a line between the negative voltage terminal and the other end of the first inverting switch 334.

The step-down output control section 340 includes a reference voltage generating section 342, a difference detector 344, a step-down phase correcting section 346 and a step-down on-duty deciding section 350. The reference voltage generating section 342 generates reference voltage that is the standard of the voltage to be supplied to the DUT 15. Then, the reference voltage generating section 342 outputs the generated reference voltage to the difference detector 344. The difference detector 344 outputs a signal presenting a difference between the reference voltage received from the reference voltage generating section 342 and the voltage outputted out of the step-up output circuit 390 to the step-down on-duty deciding section 350. The step-down phase correcting section 346 corrects phase of the signal outputted out of the step-up output circuit 390 and inputted to the difference detector 344 so that the phase of the signal outputted out of the difference detector 344 becomes closer to the phase of the signal presenting the voltage outputted out of the step-up output circuit 390.

Based on the result detected by the difference detector 344, the step-down on-duty deciding section 350 controls the step-down output circuit 360 so that the voltage supplied from the step-up output circuit 390 to the DUT 15 becomes closer to the reference voltage. The step-down on-duty deciding section 350 includes a step-down triangular wave generating section 352, a comparator 354, a buffer 356 and a step-down switch control section 358. The step-down triangular wave generating section 352 generates a signal presenting a triangular wave having predetermined amplitude and frequency. Then, the step-down triangular wave generating section 352 outputs the generated signal to the comparator 354. The comparator 354 outputs a step-down driving signal that is a signal representing a difference between the signal received from the step-down triangular wave generating section 352 and the signal received from the difference detector 344 to the buffer 356. The buffer 356 buffers the signal received from the comparator 354 and outputs it to the step-down switch control section 358.

Based on the step-down driving signal received from the buffer 356, the step-down switch control section 358 controls first and second step-down switches 364 and 366 contained in the step-down output circuit 360. Here, the step-down switch control section 358 inverts a signal for controlling the first step-down switch 364 and a signal for controlling the second step-down switch 366 from each other. That is, the step-down switch control section 358 controls the first and second step-down switches 364 and 366 so as to disconnect the second step-down switch 366 in connecting the first step-down switch 364 and to connect the second step-down switch 366 in disconnecting the first step-down switch 364. More specifically, the step-down switch control section 358 may connect the second step-down switch 366 during when the step-down driving signal received from the comparator 354 presents a positive difference, i.e., during when the logic value is H for example, by outputting the step-down driving signal received from the buffer 356 as the control signal of the second step-down switch 366. The step-down switch control section 358 may also connect the first step-down switch 364 during when the received step-down driving signal presents a negative difference, i.e., during when the logic value is L for example, by outputting an inversion signal of the received step-down driving signal as the control signal of the first step-down switch 364. The step-down on-duty deciding section 350 decides step-down on-duty that is a ratio of a time during which the second step-down switch 366 is connected to a time during which the first step-down switch 364 is connected by performing PWM (Pulse Width Modulation) as described above.

The step-down output circuit 360 supplies predetermined voltage to the step-up output circuit 390 by connecting the positive voltage terminal and the negative voltage terminal contained in the inverted output circuit 330 with the outside, i.e., the step-up output circuit 390, while switching them by the predetermined duty ratio. The step-down output circuit 360 includes a step-down inductance 362, the first step-down switch 364 and the second step-down switch 366. One end of the step-down inductance 362 is connected to the side of the positive voltage terminal and the negative voltage terminal and another end thereof is connected to the side of the step-up output circuit 390. One end of the first step-down switch 364 is connected to the side of the negative voltage terminal and another end thereof is connected to a line between the positive voltage terminal and one end of the step-down inductance 362. One end of the second step-down switch 366 is connected to the side of the positive voltage terminal and another end thereof is connected to a line between the other end of the first step-down switch 364 and one end of the step-down inductance 362.

The includes a step-up mode control section 372, a polarity control signal generating section 374, a step-up control signal generating section 376, a first step-up buffer 378, a second step-up buffer 380, a third step-up buffer 382 and a step-up switch control section 384. The step-up mode control section 372 decides whether or not the step-up output circuit 390 steps up the step-down output voltage outputted out of the step-down output circuit 360 and a step-up direction, whether positive or negative direction, when the step-up output circuit 390 steps up. It also controls the polarity control signal generating section 374 and the step-up control signal generating section 376. When the step-up output circuit 390 steps up the step-down output voltage outputted out of the step-down output circuit 360, the polarity control signal generating section 374 generates a polarity control signal indicating the step-up direction, i.e., the positive or negative direction. In the present embodiment, the polarity control signal generating section 374 generates the polarity control signal whose logic value is H in stepping up in the positive direction and the signal whose logic value is L in stepping up in the negative direction. Then, the polarity control signal generating section 374 outputs the generated polarity control signal to the first step-up buffer 378 and the second step-up buffer 380. The step-up control signal generating section 376 generates a step-up control signal indicating whether or not the step-up output circuit 390 steps up the step-down output voltage outputted out of the step-down output circuit 360. In the present embodiment, the step-up control signal generating section 376 generates the step-up control signal having a logic value L in stepping up the step-down output voltage outputted out of the step-down output circuit 360 and having a logic value H in stepping up no step-down output voltage. Then, the step-up control signal generating section 376 outputs the generated step-up control signal to the third step-up buffer 382.

The first step-up buffer 378 receives the step-down driving signal outputted out of the comparator 354 and the polarity control signal outputted out of the polarity control signal generating section 374. Then, an output of the first step-up buffer 378 is enabled when an inverted value of the polarity control signal is logic value L, i.e., when the logic value of the polarity control signal is H, and the first step-up buffer 378 outputs the step-down driving signal outputted out of the comparator 354 to the third step-up buffer 382. When the logic value of the polarity control signal is L, the output of the first step-up buffer 378 is disabled and the first step-up buffer 378 outputs no signal to the third step-up buffer 382.

The second step-up buffer 380 receives the control signal outputted out of the comparator 354 and the polarity control signal outputted out of the polarity control signal generating section 374. Then, the output of the second step-up buffer 380 is enabled when the logic value of the polarity control signal is L and the second step-up buffer 380 outputs an inverted signal of the step-down driving signal outputted out of the comparator 354 to the third step-up buffer 382. The output of the second step-up buffer 380 is disabled when the logic value of the polarity control signal is H and the second step-up buffer 380 outputs no signal to the third step-up buffer 382.

The third step-up buffer 382 receives the step-up control signal outputted out of the step-up control signal generating section 376 and the signal outputted out of the buffer, i.e., either the first step-up buffer 378 or the second step-up buffer 380, which has been enabled by the polarity control signal. Then, the third step-up buffer 382 outputs the step-up driving signal that is an inverted signal of the signal received out of the first step-up buffer 378 or the second step-up buffer 380 to the step-up switch control section 384 when the logic value of the step-up control signal is L. Thereby, the third step-up buffer 382 outputs the step-up driving signal, i.e., the inverted step-down driving signal, when the output of the first step-up buffer 378 is enabled and outputs the step-up driving signal whose logic value is the same with the step-down driving signal when the output of the second step-up buffer 380 is enabled. When the logic value of the step-up control signal is H, the third step-up buffer 382 outputs the step-up driving signal whose logic value is H to the step-up switch control section 384 regardless of a value of the signal received from the first step-up buffer 378 or that of the signal received from the second step-up buffer 380.

Based on the step-up driving signal received from the third step-up buffer 382, the step-up switch control section 384 controls the first step-up switch 392 and the second step-up switch 394 contained in the step-up output circuit 390. Here, the step-up switch control section 384 inverts a signal for controlling the first step-up switch 392 and a signal for controlling the second step-up switch 394 from each other. That is, the step-up switch control section 384 controls the first step-up switch 392 and the second step-up switch 394 so as to disconnect the second step-up switch 394 in connecting the first step-up switch 392 and to connect the second step-up switch 394 in disconnecting the first step-up switch 392. More specifically, the step-up switch control section 384 connects the first step-up switch 392 during when the logic value of the received step-up driving signal is H by outputting the step-up driving signal received from the third step-up buffer 382 as the control signal of the first step-up switch 392. Still more, the step-up switch control section 384 connects the second step-up switch 394 during when the logic value of the step-up driving signal received from the third step-up buffer 382 is L by outputting an inverted signal of the received step-up driving signal as the control signal of the second step-up switch 394. Thus the step-up output control section 370 determines a step-up on-duty that is a ratio of a time during which the second step-up switch 394 is connected to a time during which the first step-up switch 392 is connected.

The step-up switch control section 384 thus connects the first step-up switch 392 and disconnects the second step-up switch when the logic value of the step-up control signal generated by the step-up control signal generating section 376 is H. Then, the step-up switch control section 384 synchronizes the state of connection of the first step-down switch 364 with the second step-up switch 394 when the logic value of the step-up control signal is L and the logic value of the polarity control signal generated by the polarity control signal generating section 374 is L. Still more, the step-up switch control section 384 synchronizes the state of connection of the first step-down switch 364 with the first step-up switch 392 when the logic value of the step-up control signal is L and the logic value of the polarity control signal is H.

The step-up output circuit 390 supplies step-up output voltage whose absolute value is greater than the step-down output voltage outputted out of the step-down output circuit 360 by switching whether or not the step-down output circuit 360 is connected to the DUT 15 with a predetermined duty ratio. The step-up output circuit 390 includes the first step-up switch 392 and the second step-up switch 394. One end of the first step-up switch 392 is connected to the side of another end of the step-down inductance 362 and another end thereof is connected to the side of the DUT 15. One end of the second step-up switch 394 is connected with a line between the other end of the step-down inductance 362 and one end of the first step-up switch 392 and another end thereof is connected with a line between the negative electrode of the power supply 300 and one end of the inverting inductance 332. One end of the step-up capacitor 398 is connected with a line between the first step-up switch 392 and the DUT 15 and another end thereof is connected with a line between the DUT 15 and the negative electrode of the power supply 300.

Next, a point how the power-supply circuit 30 freely selects the voltage outputted out of the step-down output circuit 360 among the positive and negative voltages by controlling the inverted on-duty in the inverted output circuit 330 and the step-down on-duty in the step-down output circuit 360.

A case when the inverted on-duty and the step-down on-duty are determined so as to flow the current between the negative voltage terminal contained in the inverted output circuit 330 and the step-down output circuit 360 in the direction from the negative voltage terminal to the step-down output circuit 360 will be explained first. In this case, the inverted output control section 310 determines the inverted on-duty so that the inverting inductance 332 generates predetermined negative voltage by flowing feedback current from the step-down output circuit 360 to the inverted output circuit 330 into the inverting inductance 332. More specifically, the inverted output control section 310 employs inverted on-duty that is smaller than the step-down on-duty and that shortens the time during which the second inverting switch 336 is connected more than the time during which the second step-down switch 366 is connected. Thereby, the power-supply circuit 30 can flow the current in the direction from the negative voltage terminal to the step-down output circuit 360 by regenerating the current by releasing, during when the first step-down switch 364 is connected, electromagnetic energy accumulated in the step-down inductance 362 by the positive voltage $V_{PP}$ when the second step-down switch 366 has been connected. Accordingly, the step-down output circuit 360 can output plus step-down output voltage to the step-up output circuit 390.

Next, a case of determining the inverted on-duty and the step-down on-duty so as to flow the current between the negative voltage terminal contained in the inverted output circuit 330 and the step-down output circuit 360 in a direction from the step-down output circuit 360 to the negative voltage terminal will be explained. In this case, the inverted output control section 310 determines the inverted on-duty so as to generate predetermined negative voltage by the inverting inductance 332 by flowing the current flown into the negative voltage terminal into the inverting inductance 332. More specifically, the inverted output control section 310 employs inverted on-duty that is greater than the step-down on-duty and that prolongs the time during which the second inverting switch 336 is connected more than the time during which the second step-down switch 366 is connected. Thereby, the power-supply circuit 30 can flow the current in the direction from the step-down output circuit 360 to the negative voltage terminal by regenerating the current by releasing, during when the first inverting switch 334 is connected, the electromagnetic energy accumulated in the inverting inductance 332 by the positive voltage $V_{PP}$ when the second inverting switch 336 has been connected. Accordingly, the step-down output circuit 360 can output minus step-down output voltage to the step-up output circuit 390.

It is noted that in the power-supply circuit 30 of the present embodiment, the first and second inverting switches 334 and 336 as well as the first and second step-down switches 364 and 366 need not be controlled in synchronism from each other and may be switched at different cycle.

As described above, the power-supply circuit 30 of the present embodiment is capable of freely selecting the positive voltage and negative voltage from the single power supply 300 and of outputting from the step-down output circuit 360 without flowing the current backward. More specifically, it is possible to prevent the current from flowing backward to the power supply 300 even when the step-down output circuit 360 outputs minus voltage by regenerating the current by using the inverting inductance 332.

Then, the direction of the average current flown by the step-down inductance 362 may be set in the direction from the step-down inductance 362 to the step-up output circuit 390 by prolonging the time during which the electromagnetic energy is accumulated in the step-down inductance 362 by the positive voltage $V_{PP}$ more than the time during which the electromagnetic energy is accumulated in the inverting inductance 332 by the positive voltage $V_{PP}$. That is, it is possible to output the plus voltage to the step-up output circuit 390.

Still more, the direction of the average current flown by the step-down inductance 362 may be set in the direction from the step-up output circuit 390 to the step-down inductance 362 by shortening the time during which the electromagnetic energy is accumulated in the step-down inductance 362 by the positive voltage $V_{PP}$ more than the time during which the electromagnetic energy is accumulated in the inverting inductance 332 by the positive voltage $V_{PP}$. That is, it is possible to output the minus voltage to the step-up output circuit 390.

Then, it is possible to generate the step-up output voltage whose absolute value is large and to supply the generated step-up output voltage to the DUT 15 by stepping up the step-down output voltage outputted out of the step-down output circuit 360 by using the step-up output circuit 390. Thereby, the power-supply circuit 30 can expand the range of the voltage to be supplied to the DUT 15.

Still more, it is possible to test various DUTs 15 whose driving voltage is different by using the test apparatus 10 having the power-supply circuit 30 described above.

Figure 3:
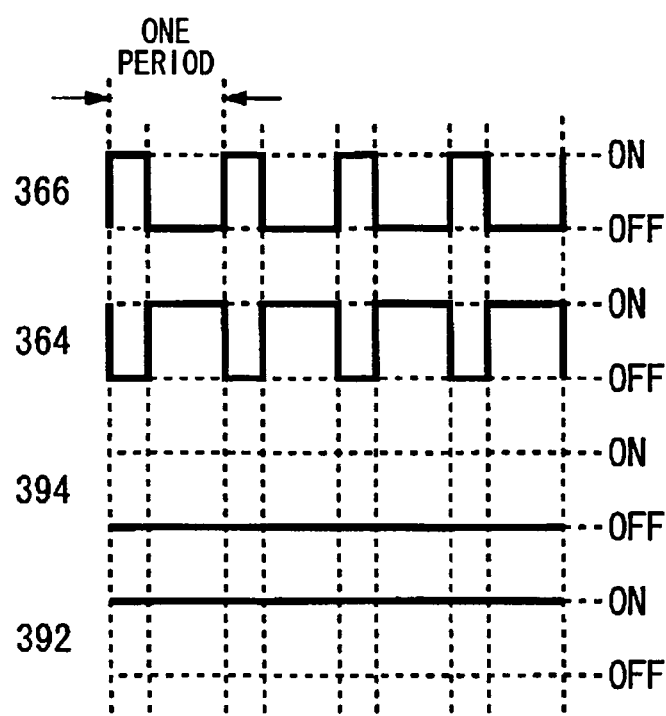
FIG. 3 is a chart showing a first exemplary state of connection among a first step-down switch 364, a second step-down switch 366, a first step-up switch 392 and a second step-up switch 394 according to the embodiment of the invention.
Figure 4:
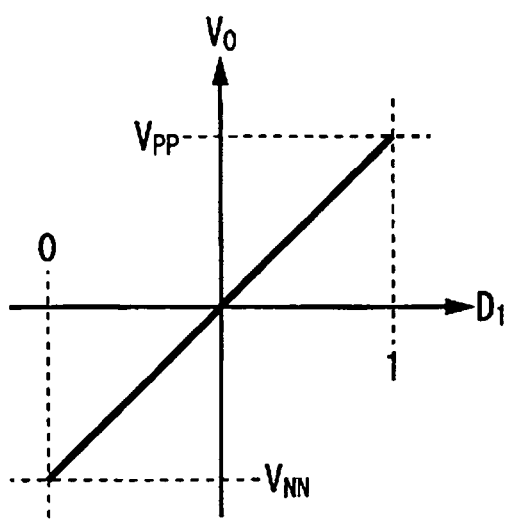
FIG. 4 is a graph showing one exemplary correlation between step-down on-duty in the example shown in FIG. 3 and an average value $V_0$ of the voltage supplied to a DUT 15.

FIG. 3 is a chart showing a first exemplary state of connection among the first step-down switch 364, the second step-down switch 366, the first step-up switch 392 and the second step-up switch 394 of the embodiment. FIG. 4 is a graph showing one exemplary correlation between step-down on-duty in the example shown in FIG. 3 and the average value $V_O$ of the voltage supplied to the DUT 15.

In this example, the step-up control signal generating section 376 generates the step-up control signal whose logic value is H. Thereby, the step-up output control section 370 always disconnects the second step-up switch 394 and always connects the first step-up switch 392 regardless of the polarity control signal generated by the polarity control signal generating section 374 as shown in FIG. 3. That is, the power-supply circuit 30 supplies the step-down output voltage outputted out of the step-down output circuit 360 to the DUT 15 in this case.

Here, the average value $V_O$ of the voltage supplied to the DUT 15 in this example will be represented by means of equations. The step-down on-duty that is the ratio of the time during which the second step-down switch 366 is connected to the time during which the first step-down switch 364 is connected will be denoted as $D_1$ hereinafter. Still more, the inverted on-duty that is the ratio of the time during which the second inverting switch 336 is connected to the time during which the first inverting switch 334 is connected will be denoted as $D_2$.

The negative voltage $V_{NN}$ outputted out of the inverted output circuit 330 may be expressed by using the positive voltage $V_{PP}$ and the inverted on-duty $D_2$, as follows:

$$V_{NN} = -\frac{D_2}{1-D_2} \times V_{PP} \qquad (1)$$

The variation of the current $I_{Lon}$ of the step-down inductance 362 when the second step-down switch 366 is connected may be expressed by using the inductor value $L_1$ of the step-down inductance 362 and the switching frequency $f_S$ of the first step-down switch 364 and the second step-down switch 366, as follows:

$$\Delta I_{Lon} = \frac{V_{PP} - V_O}{L_1} \times \frac{D_1}{f_S} \qquad (2)$$

Still more, the variation of the current $I_{Loff}$ flowing through the step-down inductance 362 when the second step-down switch 366 is disconnected may be expressed as follows:

$$\Delta I_{Loff} = -\frac{V_{NN} - V_O}{L_1} \times \frac{1-D_1}{f_S} \qquad (3)$$

Here, amplitude of $\Delta I_{Lon}$ shown in Equation (2) is almost equal with that of $\Delta I_{Loff}$ shown in Equation (3) in a stationary state:

$$|\Delta I_{Lon}| = |\Delta I_{Loff}| \qquad (4)$$

$$V_O = V_{PP} \times D_1 + V_{NN} \times (1-D_1) = \frac{D_1 - D_2}{1-D_2} \times V_{PP} \qquad (5)$$

Here, when an absolute value of $V_{PP}$ and $V_{NN}$ is approximately equal, i.e., $D_2$ is almost 0.5, the correlation of $D_1$ with $V_O$ may be expressed as shown in FIG. 4.

As described above, the power-supply circuit 30 of the present embodiment can supply the voltage in the range from the negative voltage $V_{NN}$ to the positive voltage $V_{PP}$ to the DUT 15 corresponding to the value of the step-down on-duty $D_1$ by setting the value of the step-up control signal at the logic value H.

Figure 5:
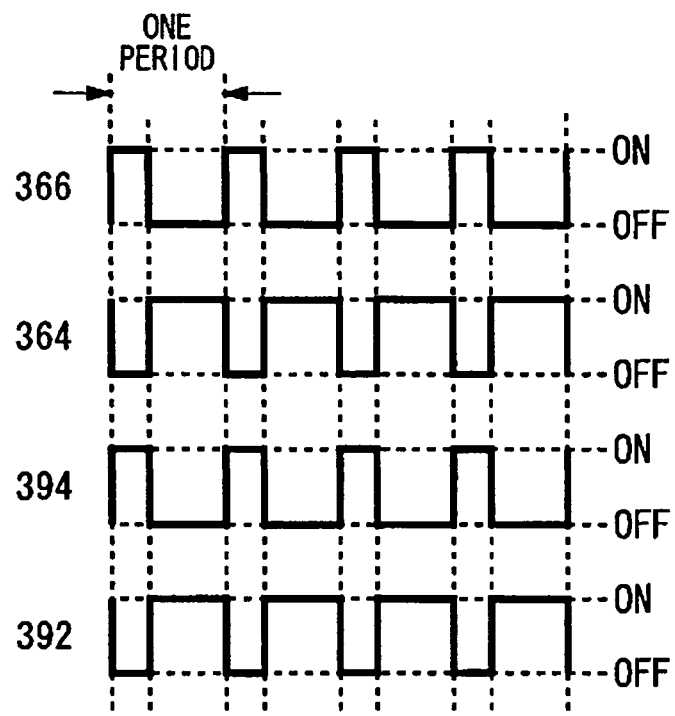
FIG. 5 is a chart showing a second exemplary state of connection among the first step-down switch 364, the second step-down switch 366, the first step-up switch 392 and the second step-up switch 394 according to the embodiment of the invention.
Figure 6:
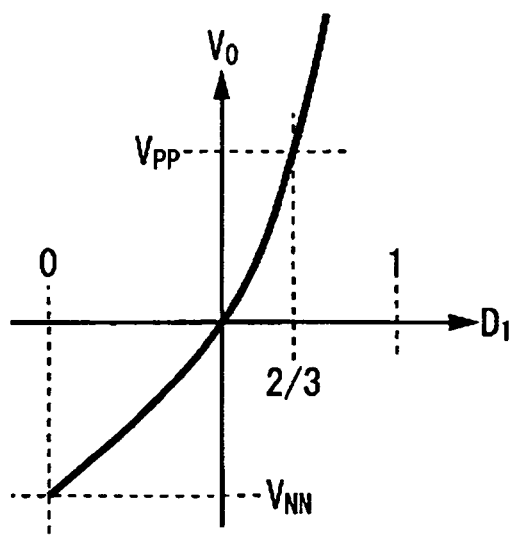
FIG. 6 is a graph showing one exemplary correlation between the step-down on-duty in the example shown in FIG. 5 and an average value $V_0$ of the voltage supplied to the DUT 15.

FIG. 5 is a chart showing a second exemplary state of connection among the first step-down switch 364, the second step-down switch 366, the first step-up switch 392 and the second step-up switch 394 of the embodiment. FIG. 6 is a graph showing one exemplary correlation between the step-down on-duty in the example shown in FIG. 5 and the average value $V_O$ of the voltage supplied to the DUT 15.

In this example, the power-supply circuit 30 supplies the step-up output voltage that is higher than the positive voltage $V_{PP}$ to the DUT 15. Then, the step-up control signal generating section 376 generates the step-up control signal whose logic value is L in this example. Still more, the polarity control signal generating section 374 generates the polarity control signal whose logic value is H in this example. Thereby, the step-up output control section 370 connects the second step-up switch 394 when the second step-down switch 366 is connected and disconnects the second step-up switch 394 when the second step-down switch 366 is disconnected as shown in FIG. 5.

Here, the average value $V_O$ of the voltage supplied to the DUT 15 in this example will be shown by means of equations. It is noted that in the present embodiment, the step-up on-duty that is a ratio of a time during which the second step-up switch 394 is connected to a time during which the first step-up switch 392 is connected is equal to the step-down on-duty because the state of connection of the second step-down switch 366 is synchronized with the second step-up switch 394.

Variation of the current $I_{Lon}$ flown by the step-down inductance 362 when the second step-down switch 366 and the second step-up switch 394 are connected may be expressed as follows:

$$\Delta I_{Lon} = \frac{V_{PP} - 0}{L_1} \times \frac{D_1}{f_S} \quad (6)$$

Still more, variation of the current $I_{Loff}$ flown by the step-down inductance 362 when the second step-down switch 366 and the second step-up switch 394 are disconnected may be expressed as follows:

$$\Delta I_{Loff} = -\frac{V_{NN} - V_O}{L_1} \times \frac{1 - D_1}{f_S} \quad (7)$$

Here, amplitude of $\Delta I_{Lon}$ shown in Equation (6) is almost equal to that of $\Delta I_{Loff}$ shown in Equation (7), so that $V_O$ may be expressed as follows:

$$V_O = \frac{D_1 \times V_{PP}}{1 - D_1} + V_{NN} = \left(\frac{D_1}{1 - D_1} - \frac{D_2}{1 - D_2}\right) \times V_{PP} \quad (8)$$

When the absolute value of $V_{PP}$ is almost equal to that of $V_{NN}$, i.e., when $D_2$ is almost 0.5 here, the correlation of $D_1$ with $V_O$ may be expresses as shown in FIG. 6.

The power-supply circuit 30 of the present embodiment is capable of increasing the average value $V_O$ of the voltage supplied to the DUT 15 to be higher than the positive voltage $V_{PP}$ by synchronizing the state of connection of the second step-down switch 366 and the second step-up switch 394 and by controlling the first step-down switch 364, the second step-down switch 366, the first step-up switch 392 and the second step-up switch 394 so that the step-down on-duty and step-up on-duty are larger than a predetermined value such as ⅔.

Figure 7:
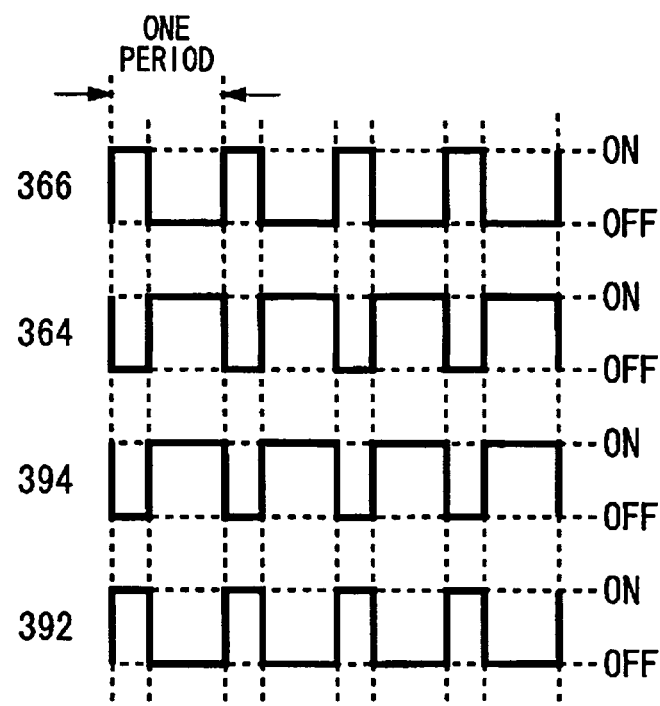
FIG. 7 is a chart showing a third exemplary state of connection among the first step-down switch 364, the second step-down switch 366, the first step-up switch 392 and the second step-up switch 394 according to the embodiment of the invention.
Figure 8:
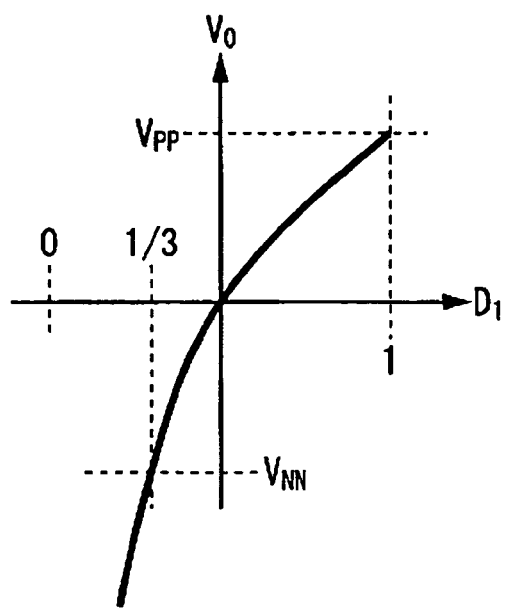
FIG. 8 is a graph showing one exemplary correlation between the step-down on-duty in the example shown in FIG. 7 and an average value $V_0$ of the voltage supplied to the DUT 15.

FIG. 7 is a chart showing a third exemplary state of connection among the first step-down switch 364, the second step-down switch 366, the first step-up switch 392 and the second step-up switch 394 according to the embodiment of the invention. FIG. 8 is a graph showing one exemplary correlation between the step-down on-duty in the example shown in FIG. 8 and an average value $V_O$ of the voltage supplied to the DUT 15.

In this example, the power-supply circuit 30 supplies step-up output voltage that is lower than the negative voltage $V_{NN}$ to the DUT 15. Then, the step-up control signal generating section 376 generates the step-up control signal whose logic value is L in this example. Still more, the polarity control signal generating section 374 generates the polarity control signal whose logic value is L in this example. Thereby, the step-up output control section 370 disconnects the second step-up switch 394 when the second step-down switch 366 is connected and connects the second step-up switch 394 when the second step-down switch 366 is disconnected as shown in FIG. 5.

Here, the average value $V_O$ of the voltage supplied to the DUT 15 in this example will be shown by means of equations. It is noted that the state of connection of the second step-down switch 366 is synchronized with that of the second step-up switch 394 in this example, so that the a step-up on-duty which is a ratio of a time during which the second step-up switch 394 is connected to a time during which the first step-up switch 392 is connected is equal to an inverse number of the step-down on-duty.

Variation of the current $I_{Lon}$ flown by the step-down inductance 362 when the second step-down switch 366 and the first step-up switch 392 are connected may be expressed as follows:

$$\Delta I_{Lon} = \frac{V_{PP} - V_O}{L_1} \times \frac{D_1}{f_S} \quad (9)$$

Variation of the current $I_{Loff}$ flown by the step-down inductance 362 when the second step-down switch 366 and the first step-up switch 392 are disconnected may be expressed as follows:

$$\Delta I_{Loff} = -\frac{V_{NN} - V_O}{L_1} \times \frac{1 - D_1}{f_S} \quad (10)$$

Here, amplitude of $\Delta I_{Lon}$ shown in Equation (9) is almost equal to that of $\Delta I_{Loff}$ shown in Equation (10), so that $V_O$ may be expressed as follows:

$$V_O = V_{PP} + \frac{1 - D_1}{D_1} \times V_{NN} = \left(1 - \frac{D_2 \times (1 - D_1)}{D_1 \times (1 - D_2)}\right) \times V_{PP} \quad (11)$$

When the absolute value of $V_{PP}$ is almost equal to that of $V_{NN}$, i.e., when $D_2$ is almost 0.5 here, the correlation of $D_1$ with $V_O$ may be expresses as shown in FIG. 8.

The power-supply circuit 30 of the present embodiment is thus capable of lowering the average value $V_O$ of the voltage supplied to the DUT 15 to be lower than the negative voltage $V_{NN}$ by synchronizing the state of connection of the second step-down switch 366 and the first step-up switch 392 and by controlling the first step-down switch 364, the second step-down switch 366, the first step-up switch 392 and the second step-up switch 394 so that the is smaller than a predetermined value such as ⅓.

It is noted that although the power-supply circuit 30 has supplied the voltage to one DUT 15 in the explanation described above, the power-supply circuit 30 may supply the voltage to a plurality of DUTs 15 instead. In this case, the power-supply circuit 30 may have a plurality of step-up output circuits 390 for supplying step-up output voltage to the DUTs 15 different from each other. Still more, the power-supply circuit 30 may have a plurality of step-down output circuits 360 for outputting step-down output voltage to the step-up output circuits 390 different from each other. Then the inverted output circuit 330 may output positive voltage and negative voltage to each of the plurality of step-down output circuits 360 while keeping the same direction in terms of the directions of the current flowing between the positive voltage terminal and each of the plurality of step-down output circuits 360 and the current flowing between the negative voltage terminal and the plurality of step-down output circuits 360. It is noted that in this case, the step-down output control section 340 may control each step-down output circuit 360 by using step-down on-duty different from each other.

The power-supply circuit 30 of the present embodiment allow the positive voltage and the negative voltage to be freely selected and the wide range of voltage to be supplied to the respective DUTs 15 even when the plurality of step-up output circuits 390 for supplying voltage to the plurality of DUTs 15 is provided. Still more, because the step-down on-duty is not required to be synchronized with the inverted on-duty, it is possible to supply driving voltage to each DUT 15 from one power supply 300 even when driving voltage of the DUT 15 differs per each DUT 15.

Still more, although the power-supply circuit 30 has been provided within the test apparatus 10 for testing the DUT 15 in the embodiments described above, the power-supply circuit 30 may be provided within another apparatus and may supply voltage to a load other than the DUT 15.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention can realize the power-supply circuit and the test apparatus that allow positive voltage and negative voltage to be freely selected and to be supplied to a load by using one power supply and that allows the range of the voltage supplied to the load to be expanded.

What is claimed is:

1. A power-supply circuit for supplying voltage to a load, comprising:
   a power supply that generates power-supply voltage;
   an inverted outputting circuit having a positive voltage terminal for outputting positive voltage based on said power-supply voltage and a negative voltage terminal for outputting negative voltage generated based on said power-supply voltage and having different polarity from said positive voltage and outputting said positive and negative voltage while keeping the same direction in terms of the directions of electric current flowing between said positive voltage terminal and the outside of the inverted outputting circuit and of electric current flowing between said negative voltage terminal and the outside of the inverted outputting circuit;
   a step-down output circuit for supplying predetermined step-down output voltage to the outside of the inverted outputting circuit by connecting said positive voltage terminal and said negative voltage terminal to the outside of the inverted outputting circuit while switching said positive and negative voltage terminals with a predetermined duty ratio; and
   a step-up output circuit for supplying step-up output voltage whose absolute value is greater than that of said step-down output voltage by switching whether or not to connect said step-down output circuit with said load with a predetermined duty ratio.

2. The power-supply circuit as set forth in claim 1, wherein said inverted outputting circuit further comprises:
   an inverting inductance whose one end is connected to the side of a negative electrode of said power supply and whose other end is connected to the side of said negative voltage terminal;
   a first inverting switch whose one end is connected to the side of the other end of said inverting inductance and another end thereof is connected to the side of said negative voltage terminal; and
   a second inverting switch whose one end is connected to a line between the other end of said inverting inductance and one end of said first inverting switch and whose other end is connected to a line between a positive electrode of said power supply and said positive voltage terminal,
   wherein said power-supply circuit further comprises an inverted output control section for controlling said first and second inverting switches so as to disconnect said second inverting switch in connecting said first inverting switch and to connect said second inverting switch in disconnecting said first inverting switch.

3. The power-supply circuit as set forth in claim 2, wherein said step-down output circuit comprises:
   a step-down inductance whose one end is connected to the side of said positive voltage terminal and said negative voltage terminal and whose other end is connected to the side of said step-up output circuit;
   a first step-down switch whose one end is connected to the side of said negative voltage terminal and whose other end is connected to a line between said positive voltage terminal and said step-down inductance; and
   a second step-down switch whose one end is connected to the side of said positive voltage terminal and whose other end is connected to a line between the other end of said first step-down switch and one end of said step-down inductance,
   wherein said power-supply circuit further comprises a step-down output control section for controlling said first and second step-down switches so as to disconnect said second step-down switch in connecting said first step-down switch and to connect said second step-down switch in disconnecting said first step-down switch, and
   wherein said inverted output control section prolongs a time during which said second inverting switch is connected to be longer than a time during which said second step-down switch is connected in flowing current from said negative voltage terminal to the outside in order to generate said predetermined negative voltage by said inverting inductance by flowing feedback current from said step-down output circuit to said inverted outputting circuit into said inverting inductance.

4. The power-supply circuit as set forth in claim 3, wherein said inverted output control section shortens the time during which said second inverting switch is connected to be shorter than the time during which said second step-down switch is connected in flowing current from said step-down output circuit to said negative voltage terminal so as to flow the current flown into said negative voltage terminal into said inverting inductance so that said inverting inductance generates said predetermined negative voltage.

5. The power-supply circuit as set forth in claim 4, wherein said step-up output circuit comprises:
    a first step-up switch whose one end is connected to the side of another end of said step-down inductance and whose other end is connected to the side of said load; and
    a second step-up switch whose one end is connected to a line between the other end of said step-down inductance and one end of said first step-up switch and whose other end is connected to a line between the negative electrode of said power supply and one end of said inverting inductance,
    wherein said power-supply circuit further comprises a step-up output control section for controlling said first and second step-up switches so as to disconnect said second step-up switch in connecting said first step-up switch and to connect said second step-up switch in disconnecting said first step-up switch.

6. The power-supply circuit as set forth in claim 5, wherein said step-up output control section also connects said second step-up switch when said second step-down switch is connected and disconnects said second step-up switch when said second step-down switch is disconnected.

7. The power-supply circuit as set forth in claim 6, wherein said step-up output control section also connects said second step-up switch when said second step-down switch is connected and disconnects said second step-up switch when said second step-down switch is disconnected in order to supply said step-up output voltage higher than said positive voltage to said load.

8. The power-supply circuit as set forth in claim 7, further comprising:
    a plurality of step-up output circuits for supplying said step-up output voltage to loads different from each other; and
    a plurality of step-down output circuit for outputting said step-down output voltage to said step-up output circuits different from each other,
    wherein said inverted outputting circuit outputs said positive voltage and said negative voltage to each one of said plurality of step-down output circuits while keeping the same direction in terms of directions of current between said positive voltage terminal and each one of said plurality of step-down output circuits and of current between said negative voltage terminal and said plurality of step-down output circuits.

9. The power-supply circuit as set forth in claim 5, wherein said step-up output control section also disconnects said second step-up switch when said second step-down switch is connected and connects said second step-up switch when said second step-down switch is disconnected.

10. The power-supply circuit as set forth in claim 9, wherein said step-up output control section also disconnects said second step-up switch when said second step-down switch is connected and connects said second step-up switch when said second step-down switch is disconnected in order to supply said step-up output voltage lower than said negative voltage to said load.

11. A test apparatus for testing a device-under-test, comprising:
    a power source for generating power-supply voltage;
    an inverted outputting circuit having a positive voltage terminal for outputting positive voltage based on said power-supply voltage and a negative voltage terminal for outputting negative voltage that generated based on said power-supply voltage and having a polarity that is different from said positive voltage and outputting said positive voltage and said negative voltage by keeping the same direction in terms of directions of current flowing between said positive voltage terminal and the outside of the inverted outputting circuit and of current flowing between said negative voltage terminal and the outside of the inverted outputting circuit;
    a step-down output circuit for supplying predetermined step-down output voltage to the outside of the inverted outputting circuit by connecting said positive voltage terminal and said negative voltage terminal to the outside of the inverted outputting circuit while switching said positive and negative voltage terminals with a predetermined duty ratio;
    a step-up output circuit for supplying step-up output voltage whose absolute value is greater than that of said step-down output voltage to said device-under-test by switching whether or not connect said step-down output circuit to said device-under-test with a predetermined duty ratio; and
    a testing section for testing said device-under-test in the state in which voltage is supplied by said step-up output circuit to said device-under-test.

12. The test apparatus as set forth in claim 11, further comprising:
    a plurality of step-up output circuits for supplying said step-up output voltage to loads different from each other; and
    a plurality of step-down output circuits for outputting said step-down output voltage to said step-up output circuits different from each other,
    wherein said inverted outputting circuit outputs said positive voltage and said negative voltage to each one of said plurality of step-down output circuits by keeping the same direction in terms of directions of current flowing between said positive voltage terminal and each of said plurality of step-down output circuits and of current flowing between said negative voltage terminal and each of said plurality of step-down output circuits.

* * * * *